United States Patent [19]
Rooke

[11] Patent Number: 5,430,370
[45] Date of Patent: Jul. 4, 1995

[54] INTEGRATION CIRCUIT TO DETERMINE IGNITION TIMING

[75] Inventor: Alan Rooke, Thriftwood, England

[73] Assignee: Ford Motor Company, Dearborn, Mich.

[21] Appl. No.: 856,891

[22] PCT Filed: Feb. 18, 1991

[86] PCT No.: PCT/GB91/00238
§ 371 Date: May 11, 1992
§ 102(e) Date: May 11, 1992

[87] PCT Pub. No.: WO91/13363
PCT Pub. Date: Sep. 5, 1991

[30] Foreign Application Priority Data
May 22, 1990 [GB] United Kingdom ............... 9004063

[51] Int. Cl.$^6$ ............... G01R 19/175; H03K 5/153; G01B 7/14
[52] U.S. Cl. ............... 324/207.12; 324/207.25; 327/79
[58] Field of Search ............... 324/207.11, 207.12, 324/207.15, 207.22, 207.25; 328/150; 307/351, 358, 362; 327/79; 123/414

[56] References Cited
U.S. PATENT DOCUMENTS
4,466,022 8/1984 Hill ............... 324/207.23

FOREIGN PATENT DOCUMENTS
0376897 4/1990 European Pat. Off. .

*Primary Examiner*—Walter E. Snow
*Attorney, Agent, or Firm*—Peter Abolins; Roger L. May

[57] ABSTRACT

A signal conditioning circuit is described for detecting zero crossings in the output of an inductive or variable reluctance sensor, which comprises a circuit (20, 30) for converting the output signal of the sensor into a signal having substantially frequency independent amplitude and the same frequency as the sensor output signal and a circuit (40) for detecting zero crossings of the converted output signal. The circuit for converting the output signal of the sensor comprises a comparator (30) for comparing the instantaneous value of the output signal of the sensor with a reference signal, a resettable integration circuit (20) having a storage capacitor (26) for integrating the output of the sensor with respect to time, and an electronic switch (26) means responsive to the output signal of the comparator (30) for resetting the integration circuit by discharging the storage capacitor (24).

1 Claim, 2 Drawing Sheets

INTEGRATION CIRCUIT TO DETERMINE IGNITION TIMING

FIELD OF THE INVENTION

The present invention relates to a signal conditioning circuit intended for use with an inductive or a variable reluctance sensor as used to determine ignition timing in motor vehicles.

1. Background of the Invention

In electronic ignition systems, a transducer is required to provide an indication of the current position of the engine crankshaft. For this purpose, it is known to use a sensor comprising a wheel of soft iron which has a number of regularly spaced teeth along its periphery and forms part of a magnetic circuit. The wheel is mounted for rotation with the crankshaft and as it rotates voltages are induced in coils of the sensor on account of the changing magnetic field caused by the varying reluctance in the magnetic circuit of the sensor. This generates a generally sinusoidal voltage at the output of the sensor. one of the teeth is omitted to enable the top dead centre position of the crankshaft to be determined.

The timing information is normally required by a digital control circuit and the output signal of the sensor must be processed to generate pulses occurring at top dead centre and at regular crankshaft angles. The processing is effected by a circuit for detecting zero crossings but problems are created for this circuit by the significant dynamic range of the sensor output signal. By the nature of an inductive sensor, the amplitude of the induced signal is speed dependent and varies from less than 1 volt when the engine is being cranked to more than 30 volts when the engine is running at its maximum speed.

A particular problem occurs at low cranking speeds in that in addition to the signal being weak and the signal to noise ratio being poor, the processing circuit has to contend with the fact that the engine speed tends to fluctuate rapidly making it impossible to carry out any form of time filtering or cycle to cycle correlation. The combined effect of all these difficulties can sometimes prevent synchronisation of the sparks and inhibit starting of the engine.

A zero crossing detector normally has hysteresis built into it in order to prevent undesired dithering on switching over of its output signal. This hysteresis is created by setting a higher threshold for positive going transitions than for negative going transitions. The reliability of detection of zero crossings is increased by widening the hysteresis band but this can only be done within the limits permitted by the overall signal amplitude. Thus at maximum engine speed, one may wish to set a hysteresis band greater than the peak to peak amplitude of the output signal of the sensor at cranking speeds.

2. Description of Prior Art

To mitigate this problem, it has already been proposed in U.S. Pat. No. 4,866,298 and in GB 2,116,325 to set a reference signal in the zero crossing detector which is linked to the maximum amplitude of the sensor output signal. However, this does not suffice, of itself, to achieve reliable synchronisation under all conditions.

Systems are described in GB 1,549,204 and U.S. Pat. No. 4,184,203 which use an inductive sensor and regulate the sensor output to produce a signal of substantially constant amplitude, however, these systems are not intended nor capable of identifying a missing tooth in a toothed wheel.

It has been proposed in GB 2,116,325 to generate a reference voltage which itself varies as a function of engine speed however this results in a system of considerable complexity.

OBJECT OF THE INVENTION

The invention seeks to provide a signal conditioning circuit for detecting zero crossings in the output of an inductive sensor which is or simple and reliable construction yet makes allowance for the dynamic range caused by the speed dependence of the output signal of the inductive sensor.

SUMMARY OF THE INVENTION

According to the present invention there is provided a signal conditioning circuit for detecting zero crossings in the output of an inductive or variable reluctance sensor, which comprises means for converting the output signal of the sensor into a signal having substantially frequency independent amplitude and the same frequency as the sensor output signal and means for detecting zero crossings of the converted output signal, characterised in that the means for converting the output signal of the sensor includes an integration circuit for integrating the output of the sensor with respect to time.

The invention is predicated on the fact that if one integrates with respect to time the function sin (wt), where w represents frequency, then the time integral is given by $(1/w)\cdot\cos(wt)$. If the amplitude of the original sine wave is proportional to frequency, then the term $(1/w)$ resulting from the integration will have the effect of removing the frequency dependence of the signal and allow a reference signal of constant value to be used for determining zero crossings in the original signal.

According to a second aspect of the invention, there is provided a signal conditioning circuit for detecting zero crossings in the output of an inductive or variable reluctance sensor, which comprises means for converting the output signal of the sensor into a signal having substantially frequency independent amplitude and the same frequency as the sensor output signal and means for detecting zero crossings of the converted output signal, characterised in that the means for converting the output of the sensor comprises a comparator for comparing the instantaneous value of the output signal of the sensor with a reference signal, a resettable integration circuit for integrating the output of the sensor with respect to time, and switching means responsive to the output signal of the comparator for resetting the integration circuit by discharging a storage capacitor in the integration circuit.

Preferably, the means for detecting zero crossings of the converted output signal of the sensor comprises a high gain differential amplifier for comparing the output of the resettable integration circuit with a reference signal derived from a sample and hold circuit which is operative to detect the peak value of the output signal of the resettable integration circuit.

According to a still further aspect of the invention, there is provided a system for detecting the angle of a shaft of internal combustion engine comprising a cog rotatable by the engine shaft relative to an inductive or variable reluctance sensor and a signal conditioning circuit as set forth above for monitoring zero crossings in the output signal of the sensor to determine the angular position of the shaft, wherein the cog has teeth regularly distributed about its circumference and one of the teeth is of a different size from the remaining teeth to provide a reference shaft timing angle.

BRIEF DESCRIPTION OF THE DRAWINGS

The invention will now be described further, by way of example, with reference to the accompanying drawings, in which.

DESCRIPTION OF THE PREFERRED EMBODIMENT

Figure 1:
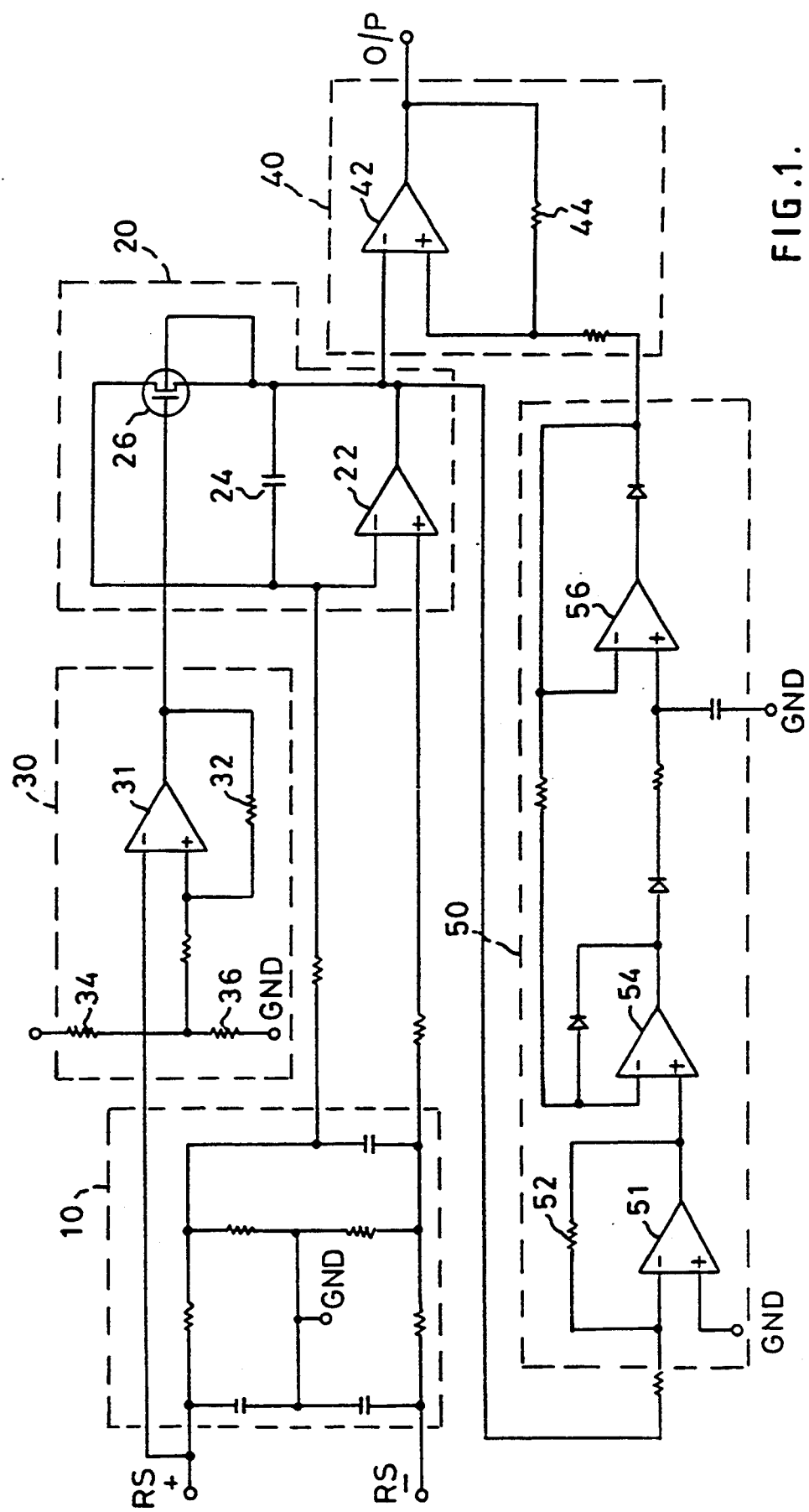
FIG. 1 shows the circuit diagram of a conditioning circuit in accordance with the present invention.

The circuit in FIG. 1 is made up of five blocks designated 10, 20, 30, 40 and 50, respectively. Block 10 is an input circuit the main purpose of which is to match the input impedance of the conditioning circuit to the output impedance of the sensor and attenuates the input signal to fall within the input range of the conditioning circuit. This circuit 10, which is made up of resistors and capacitors, is generally conventional and need not be described in detail. It should be noted from the symmetry of the input circuit 10 that the sensor has been assumed to have two balanced output coils in anti-phase with one another.

The block designated 20 is a resettable integration circuit. The circuit comprises a high input impedance operational amplifier 22 (FET input or C-MOS) with capacitative negative feedback through an integrating capacitor 24. This configuration results in a charge being developed across the capacitor 24 proportional to the time integral of the difference between the signal levels at the input terminals of the operational amplifier 22. A field effect transistor (FET) 26 is connected across the capacitor 26 which when switched on discharges the capacitor 26 to reset the integrator. While the FET 26 remains switched on, the integrator 22 acts as an inverting attenuator.

Because of the balanced sensor coils and the symmetrical input circuit 10, there will be substantial common mode rejection resulting from the differential nature of the integrator 20.

The block 30 is a comparator formed by an operational amplifier 31 with positive feedback through a resistor 32. The input signal from the sensor is compared with a reference signal (substantially 0 volts) provided by a voltage divider 34,36 connected across the voltage supply. If the sensor signal is less than the reference signal then the output of the comparator is high and conversely if it exceeds the reference signal then the comparator output is low. Each time the output goes low, the FET 26 of the integration circuit 20 is switched off to recommence integration. At the instant in time that integration recommences, the integrator output signal has a value of 0 volts because, as a voltage attenuator, its output signal will pass through zero at the same time as its input signal.

The block 40 is a zero crossing detector which is essentially a comparator similar in construction to the comparator block 30. Thus the block 40 includes an operational amplifier 42 with a positive feedback resistor 44. The output of the integration circuit is compared in the block 40 with a reference signal and the output of the operational amplifier 42 adopts one of two states (high and low) depending on which of the two input signals is the greater.

The reference signal of the block 40 is derived from the last block 50 which is an attenuating inverter followed by a sample and hold circuit. The block 50 receives its input signal from the output of the integration circuit 20 and first attenuates the signal and inverts it by means of an operational amplifier 51 with a negative feedback resistor 52. Next the signal is passed to a sample and hold circuit including two operational amplifiers 54 and 56, and a charge holding capacitor. This circuit is once again conventional and need not be described in detail. The effect of the circuit is to maintain the voltage at the output of the circuit at a level equal to the peak value of the input signal received from the inverter 51.

The operation of the circuit in FIG. 1 will now be described by reference to the waveforms shown in FIG. 2.

Figure 2:
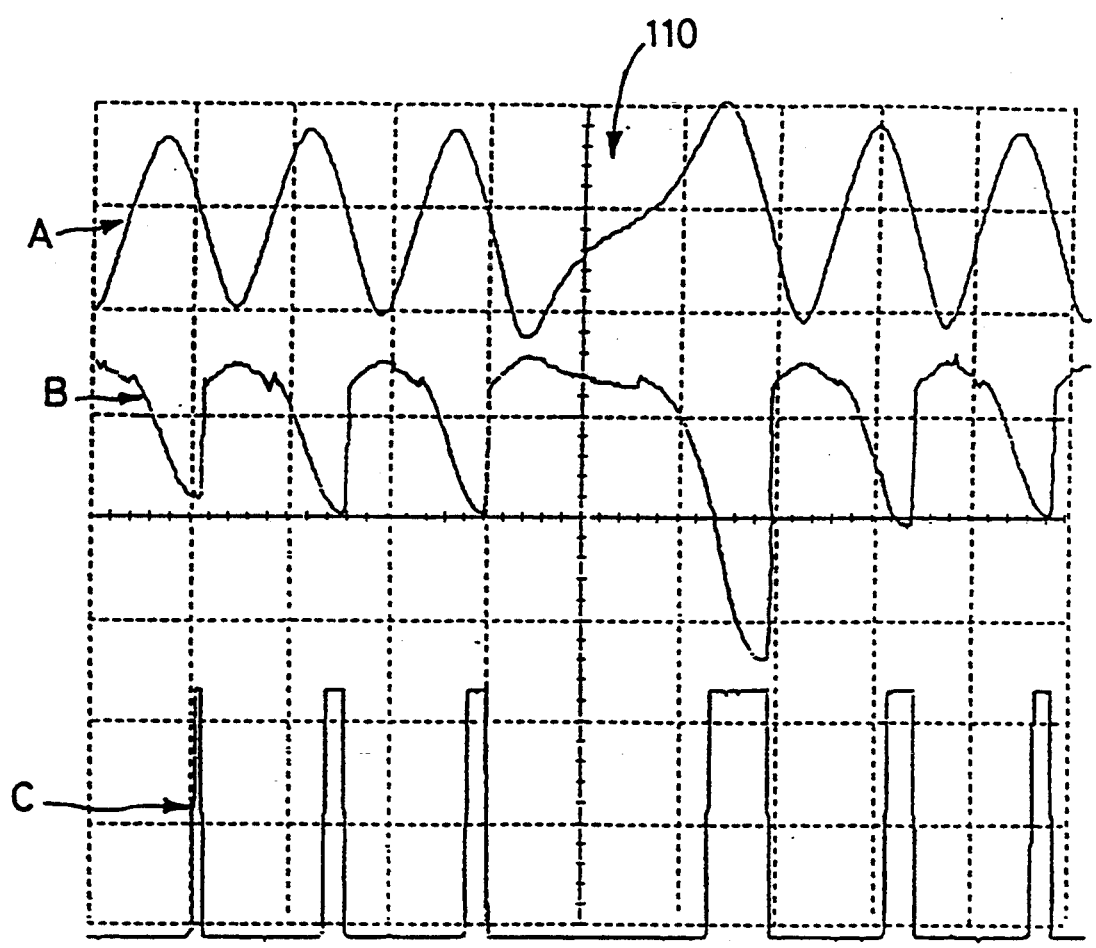
FIG. 2 shows the waveforms at various points in the circuit of FIG. 1 during operation of the circuit.

In FIG. 2, waveforms A, B and C represent the signals at the input terminal A, the output terminal B of the integrator 20 and the output terminal C of the zero crossing detector 40.

The waveform A is generally sinusoidal except in the region 110. In this waveform, each negative going zero crossing corresponds to the centre of a tooth and the region 110 corresponds to a missing tooth on the soft iron wheel. The signal has an amplitude which depends on the engine speed and which varies to a lesser extent from one engine to another on account of tolerances in the manufacture and mounting of the sensor on the engine. The signal also often has noise superimposed upon it but a clean signal has been shown to assist in understanding of the invention.

Taking any single cycle of the regular sine wave starting from its negative going zero crossing (corresponding to the centre of a tooth) one sees that the waveform B always has a very steep positive going edge coinciding with this transition. This is caused by the fact that the comparator 30 has detected the zero crossing in the waveform A and reset the integrator 20 by switching on the FET 26. The capacitor 24 is therefore rapidly discharged from whatever negative level it reached during the integration half cycle.

During the negative half cycles of the waveform A, the FET 26 remains switched on and the integrator acts as an inverting attenuator. Thus the waveform B during these half cycles follows a positive half cycle of smaller amplitude and terminates at 0 volts.

With the next positive going zero crossing of the waveform A, the FET 26 is switched off and integration recommences. The waveform B starts going negative as it integrates the sine wave generally following a cosine relationship with time until the FET is again switched on by the following negative going zero crossing of waveform A.

The amplitude of waveform B is substantially independent of frequency because as the frequency increases the amplitude of waveform A increases but this is counteracted by a reduction in the integration time. Put differently, the integral of sin(wt) with respect to time is $-\cos(wt)/w$ and the denominator of the latter cancels out the linear frequency dependence of the sensor output signal amplitude.

At the missing tooth, there is a longer and irregular negative half cycle in the waveform A which causes a longer positive half cycle in the waveform B. The shape of this part of waveform B is not important other than to notice that at the end of the negative half cycle waveform A, the signal level in waveform B is again 0 volts. In the positive half cycle, there is a longer integration time and this causes a larger negative pulse. One can, if desired merely perform a threshold comparison to determine the position of the missing tooth as this pulse is significantly larger than all the other pulses.

In the circuit described, however, the position of the each tooth is determined by applying the waveform B to a zero crossing detector 40 to produce the waveform C. The zero crossing detector goes high when the waveform B drops below a fairly large negative voltage and returns to its low state when the voltage in waveform B again rises to 0. The effect of the circuit 50 is to set the first threshold in dependence upon the peak negative values attained. As one wishes to match the threshold to the peaks corresponding to existing teeth rather than the larger peaks caused by missing teeth, the attenuator 51 in the sample and hold circuit divides the largest peaks in order to set the desired threshold value.

Because the reference value is derived from the negative peaks in the sample and hold circuit 50, any variations caused by tolerances in manufacture are automatically eliminated.

The noise immunity of the circuit of the invention stems from the fact that the integrator must have been operating for long enough to reach a certain fraction of its expected amplitude before a negative going transition in waveform A can be detected. Also, because integration occurs on a cycle by cycle basis any fluctuations in engine speed will not affect the reliability of detection.

Because the invention enables differences in size between teeth of a cog to be detected, instead of the cog having a missing tooth it may have a tooth of half height. The smaller tooth can still be detected and distinguished from the remaining teeth to provide the desired timing information. However, because no tooth is totally omitted, it is not necessary to estimate the position of the missing tooth from the timing information provided by the adjacent teeth and it is instead possible to measure the position of the smaller tooth directly.

It should be clear to those skilled in the art that various modifications may be brought to the illustrated circuit without departing from the scope of the invention as set out in the appended claims.

I claim:

1. A signal conditioning circuit for detecting zero crossings in the output of an inductive or variable reluctance sensor, which comprises means (20,30) for converting the output-signal of the sensor into a signal having substantially frequency independent amplitude and the same frequency as the sensor output signal and means (40) for detecting zero crossings of the converted output signal, the means (20,30) for converting the output of the sensor comprising a comparator (30) for comparing the instantaneous value of the output signal of the sensor with a reference signal, a resettable integration circuit (20) for integrating the output of the sensor with respect to time, and switching means (26) responsive to the output signal of the comparator (30) for resetting the integration circuit (20) by discharging a storage capacitor (24) in the integration circuit (20), the means (40) for detecting zero crossings of the converted output signal of the sensor comprising a differential amplifier (42) for comparing the output of the resettable integration circuit (20) with a reference signal derived from a sample and hold circuit (50) which detects the peak value of the output signal of the resettable integration circuit (20).

* * * * *